United States Patent
Nakamata

(10) Patent No.: US 8,520,331 B2
(45) Date of Patent: Aug. 27, 2013

(54) COLOR CONVERSION FILTER MANUFACTURING METHOD

(75) Inventor: Yuko Nakamata, Nagano (JP)

(73) Assignee: Sharp Kabushiki Kaisha, Osaka (JP)

( * ) Notice: Subject to any disclaimer, the term of this patent is extended or adjusted under 35 U.S.C. 154(b) by 259 days.

(21) Appl. No.: 12/994,183

(22) PCT Filed: Feb. 16, 2009

(86) PCT No.: PCT/JP2009/052502
§ 371 (c)(1),
(2), (4) Date: Feb. 2, 2011

(87) PCT Pub. No.: WO2010/092688
PCT Pub. Date: Aug. 19, 2010

(65) Prior Publication Data
US 2011/0128643 A1 Jun. 2, 2011

(51) Int. Cl.
*G02B 5/22* (2006.01)
(52) U.S. Cl.
USPC .......................................... 359/891; 359/900
(58) Field of Classification Search
USPC ........................................................ 359/891
See application file for complete search history.

(56) References Cited

U.S. PATENT DOCUMENTS

| | | | |
|---|---|---|---|
| 6,221,517 B1 | 4/2001 | Eida et al. | |
| 6,781,148 B2 * | 8/2004 | Kubota et al. | 257/40 |
| 2001/0043043 A1 | 11/2001 | Aoyama et al. | |
| 2003/0184216 A1 | 10/2003 | Yano et al. | |
| 2004/0038138 A1 * | 2/2004 | Kiguchi et al. | 430/7 |
| 2004/0201048 A1 | 10/2004 | Seki et al. | |
| 2005/0079644 A1 | 4/2005 | Sakurada | |
| 2006/0012288 A1 * | 1/2006 | Terakado et al. | 313/503 |
| 2008/0001528 A1 | 1/2008 | Eida | |

FOREIGN PATENT DOCUMENTS

| | | |
|---|---|---|
| JP | 08-286033 A | 11/1996 |
| JP | 2000-353594 A | 12/2000 |
| JP | 2003-217859 A | 7/2003 |
| JP | 2003-229260 A | 8/2003 |
| JP | 2003-229261 A | 8/2003 |
| JP | 2002-75643 A | 9/2003 |
| JP | 2004-253179 A | 9/2004 |
| JP | 2005-156739 A | 6/2005 |
| JP | 2006-032010 A | 2/2006 |
| JP | 2006-073450 A | 3/2006 |
| JP | 2006-163415 A | 6/2006 |
| JP | 2007-102030 A | 4/2007 |

* cited by examiner

*Primary Examiner* — Jade R Chwasz
(74) *Attorney, Agent, or Firm* — Rabin & Berdo, P.C.

(57) ABSTRACT

A method for manufacturing a color filter includes obtaining a color filter, treating the color filter with oxygen plasma, treating the color filter with fluorine plasma and forming one or more color conversion layers. The color filter is obtained by forming on a transparent substrate, multiple color filter layers having respective colors, and banks. The color filter layers are composed of polysiloxane and pigments. The banks are composed of resin and formed at boundaries between color filter layers of different colors. The color conversion layers have respective colors and are formed on the color filter layers by an inkjet method.

13 Claims, 1 Drawing Sheet

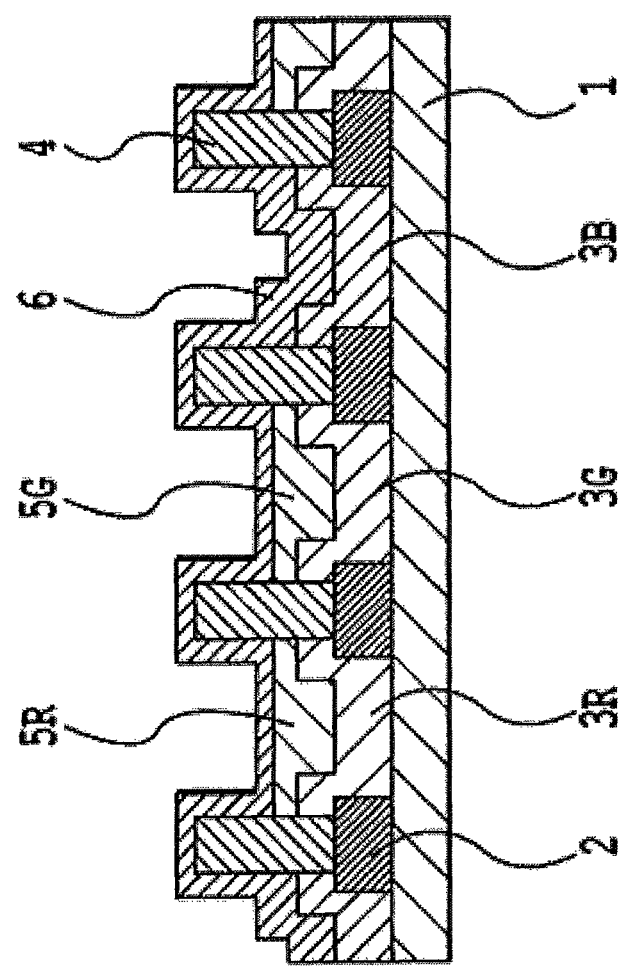

COLOR CONVERSION FILTER MANUFACTURING METHOD

BACKGROUND OF THE INVENTION

The present invention relates to a color conversion filter manufacturing method. In particular, it relates to a method for manufacturing a color conversion filter including a color conversion layer having a high-resolution pattern.

One way of achieving multicolor emission with an organic electroluminescent element is by a color conversion system. In a color conversion system, multiple colors are achieved by providing, on the front surface of an organic electroluminescent element, a color conversion layer that absorbs the light emitted by the organic electroluminescent element, converts the wavelength distribution and radiates light having a different wavelength distribution. Color conversion systems are easy to manufacture because the organic electroluminescent element is of one kind (single color), and applications to large-scale displays are being intensively investigated. Another advantage of color conversion systems is that good color reproducibility can be obtained by further combining color filter layers that transmit light in specific wavelength bands.

As such a color conversion layer, Japanese Patent Application Laid-open No. H8-286033 (Patent Document 1) discloses a configuration including a fluorescent dye dispersed in a polymer resin. In order to obtain sufficient efficiency with the proposed resin dispersion-type color conversion layer, however, the color conversion layer must be about 10 µm thick. In addition, forming the organic electroluminescent element on the upper surface of the color conversion layer requires special technology, including a technique for flattening out the irregularities on the upper surface of the color conversion layer and a technique for blocking moisture produced from the color conversion layer. All of these increase costs.

To resolve the problems of resin dispersion-type color conversion layers, Japanese Patent Application Laid-open Nos. 2002-75643 and 2003-217859 (Patent Documents 2 and 3) disclose methods for forming color conversion layers that do not contain resin by vapor deposition, sputtering and other dry processes. The problem with these methods is that although they can form color conversion layers with thicknesses of 2 µm or less, high-definition patterning (150 ppi or more for example is difficult.

Japanese Patent Application Laid-open Nos. 2004-253179, 2006-73450, 2006-32010, 2003-229261 (Patent Documents 4 to 7) and the like propose the inkjet method as a method for forming a color conversion layer with a small film thickness and a high-definition pattern. The advantage of forming a color conversion layer by the inkjet method is that the costs of forming the color conversion layer can be controlled because the ink utilization efficiency is extremely high.

Forming a high-definition pattern by the inkjet method requires precise discharge of tiny droplets, and this in turn requires low-viscosity ink. Consequently, the solids content cannot be too high since this is a cause of increased viscosity, and the volume of ink droplets needs to be large in order to obtain the necessary film thickness. As a solution for increasing the volume of ink droplets, Japanese Patent Application Laid-open No. 2000-353594 (Patent Document 8) proposes a method for forming a bank on a substrate. According to Patent Document 8, both the shape of the bank and the wetting properties of the bank surface need to be controlled in order to form a high-definition pattern. Specifically, the bank surface must be liquid-repellent with respect to the ink, while the underlying surface (that is, the ink receiving surface) must be lyophilic with respect to the ink. Patent Document 8 also describes a method that includes (a) a step of forming a bank using two materials having different wetting properties, and (b) a step of plasma processing (fluorine plasma/oxygen plasma) in which multiple gasses are used and the mixing ratios of these gasses are controlled in order to control the wettability of the bank surface and form a high-definition pattern.

Alternatively, Japanese Patent Application Laid-open No. 2007-102030 (Patent Document 9) proposes a method for improving the lyophilicity of the substrate surface for the ink by subjecting a substrate with a black matrix formed thereon to atmospheric pressure plasma treatment in a mixed gas atmosphere of carbon dioxide and a noble gas when forming a color filter layer by the inkjet method using a black matrix as a separation wall (Patent Document 9). This method requires complex control of the gas mixing ratio and the like during atmospheric pressure plasma treatment.

Japanese Patent Application Laid-open No. 2003-229261 (Patent Document 7) proposes a method using a wetting property changing layer. This method includes a step of forming a wetting property changing layer so as to cover a substrate and a separation wall formed on the substrate, and a step of exposing only the part of the wetting property changing layer in contact with the substrate through a second substrate containing a photocatalyst-containing layer to thereby improve the lyophilicity of the wetting property changing layer of the exposed region for the ink. Because only the part of the wetting property changing layer that contacts the substrate is exposed in this method, it requires a mask aligned with the separation wall in the exposure step. This makes processing complex.

Japanese Patent Application Laid-open No. 2005-156739 (Patent Document 10) proposes a method for preparing a pattern formed body including a liquid-repellent part and a lyophilic part by patterned exposure of a layer containing a photocatalyst and an organic polysiloxane as a liquid repellency imparting agent. According to Patent Document 10, it is possible to prepare the pattern formed body with a color filter, metal wiring, organic electroluminescent layer, biochip or the like on the pattern formed body.

Patent Document 1: Japanese Patent Application Laid-open No. H8-286033
Patent Document 2: Japanese Patent Application Laid-open No. 2002-75643
Patent Document 3: Japanese Patent Application Laid-open No. 2003-217859
Patent Document 4: Japanese Patent Application Laid-open No. 2004-253179
Patent Document 5: Japanese Patent Application Laid-open No. 2006-73450
Patent Document 6: Japanese Patent Application Laid-open No. 2006-32010
Patent Document 7: Japanese Patent Application Laid-open No. 2003-229261
Patent Document 8: Japanese Patent Application Laid-open No. 2000-353594
Patent Document 9: Japanese Patent Application Laid-open No. 2007-102030
Patent Document 10: Japanese Patent Application Laid-open No. 2005-156739

SUMMARY OF THE INVENTION

Consequently, the problem to be solved in the present invention is to provide an easy method for adjusting interactions between underlying color filter layers and ink droplets for color conversion formation, and provide a color conversion layer having a high-definition pattern.

The color conversion filter manufacturing method of the present invention includes (1) a step of providing a color filter by forming, on a transparent substrate, multiple kinds of color filter layers composed of polysiloxane and pigments, and banks composed of resin at boundaries between different kinds of color filter layers, (2) a step of treating the color filter with oxygen plasma, (3) a step of treating the color filter with fluorine plasma, and (4) a step of forming one or multiple kinds of color conversion layers on the color filter layers of the color filter by an inkjet method. The present invention also relates to a color conversion filter manufactured by this method.

By adopting this configuration, it is possible to provide a novel method for manufacturing a color conversion filter including a color conversion layer having a high-definition pattern using the inkjet method, where both lyophilicity of the color filter layers and liquid repellency of the banks with respect to the ink used to form the color conversion layer are achieved by treating the polysiloxane-based color filter layers and the resin banks with oxygen and fluorine plasma. The costs of manufacturing a high-definition flat panel display can also be reduced by using a color conversion filter manufactured by the method of the present invention.

BRIEF DESCRIPTION OF THE DRAWINGS

FIG. 1 is a cross-section showing a color conversion filter formed by the manufacturing method of the present invention.

DESCRIPTION OF THE PREFERRED EMBODIMENT

FIG. 1 shows a color conversion filter formed by the manufacturing method of the present invention. The color conversion filter of FIG. 1 has substrate 1 on which are black matrix 2, three kinds of color filter layers 3, e.g., red, green and blue (R, G, B), banks 4 provided at the boundaries between different kinds of color filter layers 3, two kinds of color conversion layers 5, e.g., red and green (R, G) provided on the red and green color filter layers 3 (R, G), and barrier layer 6 formed so as to cover color conversion layers 5 and the layers underneath.

Black matrix 2 is formed first on transparent substrate 1, although this is an optional step. Black matrix 2 can be first formed on the entire surface of transparent substrate 1 by a coating method (spin coating or the like) and then patterned by photolithography or the like, or may be formed in a pattern by screen printing or the like.

Transparent substrate 1 is preferably formed of a material that fulfills the following conditions:
(a) having excellent optical transparency and dimensional stability;
(b) being able to withstand the conditions (solvent, temperature and the like) used in forming the layers above (black matrix 2, color filters 3, color conversion layers 5, etc.);
(c) being able to withstand the conditions (solvent, temperature and the like) used in forming the organic electroluminescent element when this element is formed above the color conversion filter; and
(d) not detracting from the performance of a multicolor emitting display formed using the resulting color conversion filter.

Examples of such materials for forming transparent substrate 1 include glass, various plastics, various films and the like.

Black matrix 2 is a layer for blocking visible light and improving contrast. The thickness of black matrix 2 can be set at will as long as it fulfills this function. Black matrix 2 may be formed from multiple stripes extending in a first direction. Alternatively, black matrix 2 may be an integral layer in the form of a lattice formed from stripes extending in a first direction and second direction (perpendicular to the first direction), with multiple openings in between. In this case, the openings in black matrix 2 delineate the subpixels. Black matrix 2 can be formed using an ordinary material used in flat panel displays.

The manufacturing method of the present invention includes four steps as follows:

In the first step, color filters are obtained by forming multiple kinds of color filter layers 3 and banks 4 at the boundaries between different kinds of color filter layers 3 on transparent substrate 1.

First, banks 4 are formed at the boundaries between different kinds of color filter layers 3. Banks 4 are formed on transparent substrate 1 when no black matrix 2 is used, or on black matrix 2 when black matrix 2 is used. Banks 4 may be formed from multiple stripes extending in a first direction for example.

Banks 4 are effective for preventing the ink used to form color conversion layer 5 from diffusing into regions where it is not wanted. In particular, banks 4 are effective when forming a color conversion layer with a high-definition pattern by the inkjet method. Because the droplets are discharged with precise control of the discharge volume when forming a high-definition pattern, the ink viscosity needs to be low, and the solids content of the ink cannot be raised because this causes increased viscosity. Therefore, a large volume of ink is required to obtain a color conversion layer of the necessary film thickness, and thus banks 4 are important for preventing diffusion.

Moreover, when color filter layers 3 are formed by the inkjet method as discussed below, banks 4 are effective for preventing the ink used to form color filter layers 3 from diffusing into regions where it is not wanted. In this case, transparent substrate 1, banks 4, and black matrix 2 (if present) can be treated with fluorine plasma prior to formation of color filter layers 3 to make banks 4 and black matrix 2 liquid-repellent with respect to the ink used to form color filter layers 3.

Banks 4 are preferably liquid-repellent with respect to the ink used to form color conversion layer 5 as discussed below. Materials for forming banks 4 include resins, particularly photo-curable resins or photo-thermosetting resins (for example, acrylic resins containing curable units and the like). Banks 4 may be formed by applying these materials to the entire surface and then patterning them, or by applying these materials only to the desired sites by screen printing or the like.

Next, multiple kinds of color filter layers 3 are formed. When banks 4 are formed from multiple stripes extending in a first direction, each of the multiple kinds of color filter layers 3 is also formed from multiple stripes extending in this first direction. Multiple kinds of color filter layers 3 each transmit light at different wavelengths to prove the desired hue of transmitted light, and also serve to improve the color purity of the transmitted light. When the color conversion filters of FIG. 1 are to be formed, it is desirable to form blue color filter layer 3B, which transmits light at wavelengths of 400 nm to 550 nm, green color filter layer 3G, which transmits light at wavelengths of 500 nm to 600 nm, and red color filter layer 3R, which transmits light at wavelengths of 600 nm and above.

Color filter layers 3 of the present invention are formed from a polysiloxane material and organic pigments dispersed in the polysilxane material. The organic pigments are each dispersed in the polysiloxane material in the amount of 1 to 20 mass % or preferably 1 to 10 mass % based on the mass of the polysiloxane material.

The polysiloxane material is formed by hydrolytic condensation or hydrolytic co-condensation of an organic dialkoxysilane, organic diacyloxysilane or other monomer (precursor). Examples of organic dialkoxysilanes that can be used include dimethyl dimethoxysilane, dimethyl diethoxysilane, diphenyl dimethoxysilane, diphenyl diethoxysilane, methylphenyl dimethoxysilane, methylvinyl dimethoxysilane, methylvinyl diethoxysilane, 3-glycidoxypropylmethyl dimethoxysilane, 3-aminopropylmethyl dimethoxysilane, N-(2-aminoethyl)-3-aminopropylmethyl dimethoxysilane, 3-chloropropylmethyl dimethoxysilane, 3-chloropropylmethyl diethoxysilane, cyclohexylmethyl dimethoxysilane, heptadecafluorodecyl methyl dimethoxysilane, 3-methacryloxypropyl dimethoxysilane, octadecylmethyl dimethoxysilane and the like. Examples of organic diacyloxysilanes that can be used include dimethyldiacetoxysilane, diphenyldiacetoxysilane and the like. Examples of organic diacyloxysilanes that can be used include dimethyldichlorosilane, diethyl dichlorosilane, diphenyl dichlorosilane, methylphenyl dichlorosilane, methylvinyl dichlorosilane, octadecylmethyl dichlorosilane, heptadecafluorodecylmethyl dichlorosilane and the like. Hydrolytic condensation or hydrolytic co-condensation can be performed by mixing one or multiple monomers under aqueous conditions in the presence of an acid catalyst. Alternatively, hydrolytic condensation or hydrolytic co-condensation of the precursor can be performed by heating at 150° C. for 30 minutes for example on transparent substrate 1.

Organic pigments that can be used for color filter layers 3 include azo lake pigments, insoluble azo pigments, condensed azo pigments, phthalocyanine pigments, quinacridone pigments, dioxazine pigments, isoindolinone pigments, anthraquinone pigments, perinone pigments, thioindigo pigments, perylene pigments, and mixtures of these.

Color filter layers 3 are prepared by affixing a dispersion of an organic pigment and a polysiloxane material or precursor thereof to transparent substrate 1 by inkjet printing, screen printing or the like. When using a precursor of a polysiloxane material, the polysiloxane is formed by hydrolytic condensation or hydrolytic co-condensation on transparent substrate 1.

In the second step, the color filter (that is, transparent substrate 1 with color filter layers 3 and banks 4 formed thereon) is subjected to oxygen plasma treatment to make the surface of color filter layers 3 lyophilic with respect to the ink used to form color conversion layer 5. This step can be omitted if the formed color filter layers 3 are already sufficiently lyophilic with respect to the ink used to form color conversion layers 5. "Oxygen plasma treatment" in the present invention is reduced-pressure plasma treatment by exposure to plasma in a reduced-pressure atmosphere at 1 to 10 Pa. In this case, the flow volume of the oxygen gas can be set to 50 to 1000 mL/minute, and the applied power to 50 to 1000 W. A contact angle of 15° or less of color filter layers 3 with the ink used to form color conversion layers 5 is preferably obtained by means of oxygen plasma treatment.

In the third step, the color filter is subjected to fluorine plasma treatment to make banks 4 liquid-repellent with respect to the ink used to form color conversion layer 5. Fluorine plasma treatment in the present invention is atmospheric-pressure plasma treatment by exposure to plasma in gas containing fluorine or a fluorine compound at roughly atmospheric pressure. Fluorine plasma treatment can be performed using a well-known surface treatment unit. Examples of fluorine compounds that can be used include $CF_4$, $CHF_3$, $SF_6$ and the like. The gas used for fluorine plasma treatment is a mixed gas including Ar or He gas containing 1 to 10% or preferably 2 to 5% fluorine or a fluorine compound. A contact angle of 30° of more of the surface of banks 4 with the ink used to form color conversion layer 5 is preferably achieved by means of fluorine plasma treatment. The oxygen plasma-treated surfaces of color filter layers 3 do not become liquid-repellent, but maintain their lyophilicity with respect to the ink even after fluorine plasma treatment.

In the fourth step, one or multiple kinds of color conversion layers 5 are formed on color filter layers 3 by the inkjet method. In the example shown in FIG. 1, red color conversion layer 5R and green color conversion layer 5G are formed. If necessary, only red color conversion 5R can be provided. Alternatively, a blue color conversion layer (not shown) can be provided in addition to red color conversion layer 5R and green color conversion layer 5G.

The ink for forming color conversion layer 5 contains at least one kind of color conversion pigment and a solvent. Examples of color conversion pigments that can be used in the present invention include tris(8-quinolinolate)aluminum complex ($Alq_3$) and other aluminum chelate pigments; 3-(2-benzothiazolyl)-7-diethylaminocoumarin (Coumarin 6), 3-(2-benzoimidazolyl)-7-diethylaminocoumarin (Coumarin 7), Coumarin 135 and other coumarin pigments; solvent yellow 43, solvent yellow 44 and other naphthalimide pigments; and other low-molecular-weight organic fluorescent pigments. A fluorescent polymer material such as polyphenylene, polyarylene or polyfluorene can also be used as the color conversion pigment.

A mixture of two or more pigments can also be used as necessary for a color conversion pigment. Using a pigment mixture is effective when the wavelength shift is large, as when converting blue light to red light. The pigment mixture may be a mixture of the pigments described above. Alternatively, the pigment mixture may be a mixture of these pigments with the following pigments:

(1) Diethylquinacridone (DEQ) and other quinacridone derivatives;
(2) 4-dicyanomethylene-2-methyl-6-(p-dimethylaminostyryl)-4H-pyran (DCM-1), 4-dicyanomethylene-2-methyl-6-(julolidine-9-enyl)-4H-pyran (DCM-2), 4-dicyanomethylene-2-t-butyl-6-(1,1,7,7-tetramethyljulolidine-9-enyl)-4H-pyran (DCJTB) and other cyanine dyes;
(3) 4,4-difluoro-1,3,5,7-tetraphenyl-4-bora-3a,4a-diaza-s-indacene;
(4) Lumogen F red;
(5) Nile red;
(6) Rhodamine B, Rhodamine 6G and other xanthene dyes; or
(7) Pyridine 1 and other pyridine dyes.

The solvent in the ink for forming color conversion layer 5 can be any solvent capable of dissolving the aforementioned color conversion pigments. For example, a nonpolar organic solvent such as toluene or a polar organic solvent such as chloroform or an alcohol or ketone can be used as the ink solvent. The ink solvent can include a single component. Alternatively, multiple solvents can be mixed to prepare the ink solvent in order to adjust the viscosity, vapor pressure, solubility and/or wetting properties.

In this embodiment, the ink can be prepared by mixing at least one kind of color conversion pigment in a solvent. The ink should preferably be prepared in an inactive gas (nitrogen gas or argon or other noble gas for example) atmosphere in order to exclude the effects of moisture and oxygen. Before preparing the ink, the solvent can be pre-treated by any means known in the field such as deaeration, moisture absorbent treatment, oxygen absorbent treatment, distillation or the like in order to remove moisture and oxygen in the solvent.

Using any inkjet unit and method known in the field, the prepared ink is affixed to plasma-treated color filter layers 3, which are divided into different kinds of color filter layers 3 by banks 4, under conditions that allow application with the desired resolution. A thermal inkjet system or piezo inkjet system can be used for the inkjet unit and method. The ink affixed by the inkjet method is prevented by banks 4 from diffusing into areas where it is not wanted, and spreads on color filter layer 3 without splattering.

After ink attachment, the solvent is removed by evaporation to form color conversion layer 5 including at least one color-conversion pigment. Color conversion layer 5 is formed in a region between two banks. When banks 4 are formed from multiple stripes extending in a first direction, color conversion layer 5 is also formed from multiple stripes extending in the first direction. Solvent removal can be accomplished by heating to a temperature at which the solvent evaporates in the inactive gas atmosphere described above or in vacuum. In this case, the heating temperature is set so as not to cause degradation or thermal decomposition of the color conversion pigment in the ink.

Finally, barrier layer 6 can be formed so as to cover black matrix 2, color filter layers 3, banks 4 and color conversion layer 5. Formation of barrier layer 6 is an optional step. When color conversion layer 5 has been formed using a material that degrades in the presence of oxygen and/or organic solvent, barrier layer 6 is useful from the standpoint of maintaining the properties of color conversion layer 5.

Barrier layer 6 is formed using a material that has barrier properties with respect to gas (including water vapor and oxygen) and organic solvents, and that is highly transparent in the visible range (preferably, with a transparency of 50% or more in the 400 to 700 nm range). The material of barrier layer 6 is preferably electrically insulating. Examples of materials that can be used to form barrier layer 6 include $SiO_x$, $AlO_x$, $TiO_x$, $TaO_x$, $ZnO_x$ and other inorganic oxides, $SiN_x$ and other inorganic nitrides, and $SiN_xO_y$ and other inorganic oxynitrides. Barrier layer 6 may be a single layer of such a material, or a laminate of multiple layers.

Barrier layer 6 can be formed by any method known in the field, such as sputtering, CVD, vacuum deposition or the like. From the standpoint of avoiding damage to color conversion layer 5 during formation of barrier layer 6, barrier layer 6 is preferably formed at a low temperature of 100° C. or less, using CVD because the energy of the particles used in film-formation is low.

The manufacturing method of the present invention was explained above using as an example the color conversion filter shown in FIG. 1, which has three kinds of color filter layers 3 and 2 kinds of color conversion layers 5. It is obvious to those skilled in the art that the manufacturing method of the present invention can be applied to a color conversion filter having 2 or 4 or more color filter layers 3.

EXAMPLES

Example 1

Color Mosaic CK-7001 (available from Fuji Film Corp.) was applied to the top of a transparent substrate (Corning 1737 glass) to form black matrix 2 having multiple rectangular openings. Black matrix 2 had a film thickness of 1 μm. Each of the rectangular opening (corresponding to subpixels) was 300 μm long×100 μm wide, and the intervals between adjacent rectangular openings were 30 μm long by 10 μm wide.

Next, a photo-curable acrylic resin (V259PA/P5, Nippon Steel Chemical Co.) was applied and patterned by photolithography to form, on black matrix 2, banks 4 formed from multiple stripes extending in the vertical direction. Each of the stripes forming banks 4 was 10 μm wide by 5 μm high.

Next, a mixed gas including 3% $CF_4$ in Ar gas was introduced into an ATOMFLO unit (Surfx Technologies) at atmospheric pressure, and transparent substrate 1 with black matrix 2 and banks 4 formed thereon was exposed to plasma. The distance between transparent substrate 1 and the plasma irradiation port was set to 1 cm.

Next, 3 mass % Chromophthal Red BRN (Ciba Geigy red pigment: diazo pigment) was mixed in dimethyldimethoxysilane to prepare a red color filter material. The resulting red color filter material was applied by the inkjet method to form red color filter layer 3R composed of multiple stripes extending in the vertical direction. Each of the multiple stripes was 1 μm thick and 110 μm wide. The multiple stripes were arranged at intervals of 220 μm, in contact with black matrix 2 and bank 4 at both edges of each stripe as shown in FIG. 1. This was then heated at 150° C. for 30 minutes to convert the dimethyldimethoxysilane to polysiloxane.

The same procedure was then repeated except that 1 mass % Lionol Green 2Y-301 (Toyo Ink Seizo: chlorobrominated copper phthalocyanine pigment) was used in place of the 3 mass % Chromophthal red BRN to form green color filter layer 3G. The same procedure was also repeated except that 1 mass % Chromophthal Blue A3R (Ciba Geigy blue pigment: indanthrene pigment) was used in place of the 3 mass % Chromophthal red BRN to form blue color filter layer 3B and obtain a color filter.

Next, the color filter was placed in a plasma treatment unit, and the pressure inside the unit was reduced to 2 Pa. 100 W of electricity was applied as oxygen was supplied to the unit at a flow rate of 100 mL/minute, and the filter was treated with oxygen plasma for 10 seconds.

Next, a mixed gas including 3% $CF_4$ in Ar gas was introduced into an ATOMFLO unit (Surfx Technologies) under atmospheric pressure, and transparent substrate 1 with black matrix 2 and banks 4 formed thereon was exposed to plasma. The distance between transparent substrate 1 and the plasma irradiation port was set at 1 cm.

Next, 1000 parts by weight of toluene and 50 parts by weight of a mixture of Coumarin 6 and DEQ (mole ratio Coumarin 6:DEQ=48:2) were mixed to prepare an ink. The prepared ink was loaded into an inkjet unit (UniJet UJ200). Next, 42 pL per subpixel of ink was applied over green color filter layer 3G in a nitrogen atmosphere. Without any break in the nitrogen atmosphere, the color filter with adhering ink was transferred to a vacuum dryer and heated to 100° C. at $1.0 \times 10^{-3}$ Pa of pressure to remove the toluene. The resulting green color conversion layer 5G was 500 nm thick.

Next, 1000 parts by weight of toluene and 50 parts by weight of a mixture of Coumarin 6 and DCM-2 (mole ratio Coumarin 6:DCM-2=48:2) were mixed to prepare ink. This prepared ink was loaded into an inkjet unit (UniJet UJ200). Next, 42 pL per subpixel of ink was applied over red color filter layer 3R in a nitrogen atmosphere. Without any break in the nitrogen atmosphere, the color filter with adhering ink was transferred to a vacuum dryer and heated to 100° C. at $1.0×10^{-3}$ Pa of pressure to remove the toluene. The resulting red color conversion layer 5R was 500 nm thick.

Without any break in vacuum, the color filter with green color conversion layer 5G and red color conversion layer 5R formed thereon was transferred to a plasma CVD unit. Silicon nitride (SiN) was deposited to a film thickness of 1 μm by plasma CVD to form barrier layer 6 and obtain a color conversion filter. Monosilane ($SiH_4$), ammonia ($NH_3$) and nitrogen ($N_2$) were used as the raw material gases here. The temperature of the color filter during formation of barrier layer 6 was maintained at 100° C. or less.

Comparative Example 1

A color conversion filter was formed by the same procedures as in Example 1 except that Color Mosaics CR-7001, CG-7001 and CB-7001 containing organic resin (available from Fuji Film) were applied in place of the mixtures of pigments and dimethyldimethoxysilane, and patterned by photolithography to form red, green and blue color filter layers 3 (R, G, B).

Comparative Example 2

A color conversion filter was prepared by the same procedures as in Example 1 except that the color filter was not treated with oxygen plasma.

Comparative Example 3

A color conversion filter was prepared by the same procedures as in Example 1 except that the color filter was not treated with fluorine plasma.

<Evaluation>

The color unevenness rate and the presence or absence of color contamination were evaluated with respect to the color conversion filters prepared in Example 1 and Comparative Examples 1 to 3. In the present invention, "unevenness" means that a region without a formed color conversion layer is present within the red and green subpixels as a result of ink rate splattering. The "color unevenness rate" is the total number of subpixels with "unevenness" as a percentage of the total number of red and green subpixels. "Color contamination" in the present invention means that either red color conversion layer 5R or green color conversion layer 5G has been formed in an undesired location because ink has overflowed banks 4 and contaminated a region of another color adjacent to the ink. The color filter materials and bank materials used in Example 1 and Comparative Examples 1 to 3 were also applied to other substrates and subjected to the same plasma treatment as in the corresponding examples and the contact angle of the surface with toluene was measured. The results are shown in Table 1.

TABLE 1

Evaluation of color conversion filters

|  |  | Ex. 1 | CE 1 | CE 2 | CE 3 |
|---|---|---|---|---|---|
| Color filter material |  | Polysiloxane | Organic resin | Polysiloxane | Polysiloxane |
| Fluorine plasma treatment before color filter layer formation |  | Yes | Yes | Yes | Yes |
| Before color conversion layer formation | Oxygen plasma treatment | Yes | Yes | No | Yes |
|  | Fluorine plasma treatment | Yes | Yes | Yes | No |

TABLE 1-continued

Evaluation of color conversion filters

|  |  | Ex. 1 | CE 1 | CE 2 | CE 3 |
|---|---|---|---|---|---|
| Contact angle | Color filter layer | 12° | 39° | 27° | 10° |
|  | Bank | 43° | 45° | 41° | 18° |
| Unevenness rate (%) |  | 5 | 70 | 75 | 4 |
| Color contamination |  | No | No | No | Yes |

As shown in Table 1, unevenness was controlled in Example 1 in which the polysiloxane-based color filter was subjected to two kinds of plasma treatment, indicating an improvement in the lyophilicity of color filter layers 3 with respect to the ink used to form the color conversion layers. There was no color contamination due to overflowing of the banks, indicating improved liquid-repellency of banks 4 with respect to the ink used to form the color conversion layers. It is thought that the unevenness rate was less and color contamination was prevented in comparison to Comparative Example 1 using an organic resin-based color filter layer because of this combination of lyophilicity and water-repellency. In Comparative Example 2 color contamination did not occur but the unevenness rate was high, indicating that oxygen plasma treatment of the polysiloxane-based color filter layers was vital for improving lyophilicity with respect to the ink used to form the color conversion layers. It can also be seen from a comparison of Example 1 and Comparative Example 3 that fluorine plasma treatment prior to color conversion layer formation is important as a means of improving the liquid-repellency of banks 4 and preventing color contamination.

It is thus possible to provide a novel method for manufacturing a color conversion filter including color conversion layers having high-definition patterns formed by the inkjet method, where both lyophilicity of the color filter layers and liquid repellency of the banks with respect to the ink used to form the color conversion layers is achieved by means of oxygen and fluorine plasma treatment using polysiloxane-based color filter layers and resin banks. It is also possible to reduce the manufacturing costs of a high-definition flat panel display by using a color conversion filter manufactured by the method of the present invention.

The invention claimed is:

1. A method for manufacturing a color filter, comprising, in the order recited, the steps of:
   forming a plurality of banks comprised of resin on a transparent substrate;
   forming, on the transparent substrate between respective banks of the plurality of banks, a plurality of color filter layers comprised of polysiloxane material and pigments dispersed in the polysiloxane material, and having respective colors, so as to form an assembly of the transparent substrate, the plurality of banks and the plurality of color filter layers;
   treating the assembly with oxygen plasma;
   treating the assembly with fluorine plasma; and
   forming at least one color conversion layer having a color respectively on the plurality of color filter layers by an inkjet method,
   wherein the pigments are organic pigments, and wherein the plurality of color filter layers are formed from polysiloxane material and organic pigments dispersed in the polysiloxane material, and wherein the polysiloxane material is provided as a precursor thereof, and forming the plurality of color filter layers includes the steps of:

affixing a dispersion of the organic pigment and the precursor of the polysiloxane material to the transparent substrate by inkjet printing or screen printing; and forming the polysiloxane material by hydrolytic condensation or hydrolytic co-condensation of the precursor of the polysiloxane material.

2. The method of claim 1, further comprising the steps of, prior to forming the plurality of banks on the transparent substrate:

forming a black matrix on the entire surface of the transparent substrate by a coating method; and patterning the black matrix by one of photolithography and screen printing to provide a patterned black matrix.

3. The method of claim 2, wherein the patterned black matrix is formed from multiple stripes extending in a first direction.

4. The method of claim 2, wherein the patterned black matrix is an integral layer in the form of a lattice formed from stripes extending in a first direction and in a second direction that is perpendicular to the first direction, with multiple openings between the stripes that define subpixels.

5. The method of claim 2, wherein the plurality of banks are formed on the black matrix.

6. The method of claim 2, further comprising a further step of treating the transparent substrate, the patterned black matrix, and the plurality of banks with fluorine plasma, prior to the formation of the plurality of color filter layers.

7. The method of claim 2, further comprising the step of forming a barrier layer so as to cover the patterned black matrix, the plurality of color filter layers, the plurality of banks, and the at least one color conversion layer.

8. The method of claim 7, wherein the barrier layer is comprised of an electrically insulating material and is a single layer or a laminate of multiple layers.

9. The method of claim 1, wherein the banks are formed as multiple stripes extending in a first direction and each of the plurality of color filter layers is formed as multiple strips extending in the first direction.

10. The method of claim 1, wherein each of the organic pigments is dispersed in the polysiloxane material in an amount of 1 to 20 mass % based on mass of the polysiloxane material.

11. The method of claim 1, wherein the oxygen plasma treatment is a reduced-pressure plasma treatment by exposure to oxygen plasma in a reduced-pressure atmosphere at 1 to 10 Pa.

12. The method of claim 1, wherein the fluorine plasma treatment is an atmospheric-pressure plasma treatment by exposure to plasma in a gas containing fluorine or a fluorine compound at roughly atmospheric pressure.

13. The method of claim 1, wherein respective color conversion layers of the at least one color conversion layer are formed in a region between two banks.

* * * * *